(12) United States Patent
Chew et al.

(10) Patent No.: US 8,835,294 B2
(45) Date of Patent: Sep. 16, 2014

(54) METHOD FOR IMPROVING THERMAL STABILITY OF METAL GATE

(75) Inventors: Han-Guan Chew, Singapore (SG); Ming Zhu, Singapore (SG); Lee-Wee Teo, Singapore (SG); Harry Hak-Lay Chuang, Hsin-Chu (TW); Yi-Ren Chen, Guishan Township (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 621 days.

(21) Appl. No.: 12/724,984

(22) Filed: Mar. 16, 2010

(65) Prior Publication Data
US 2011/0230042 A1    Sep. 22, 2011

(51) Int. Cl.
| H01L 21/3205 | (2006.01) |
| H01L 21/28 | (2006.01) |
| H01L 21/02 | (2006.01) |
| H01L 29/66 | (2006.01) |
| H01L 21/3215 | (2006.01) |
| H01L 29/49 | (2006.01) |
| H01L 21/768 | (2006.01) |
| H01L 21/8238 | (2006.01) |

(52) U.S. Cl.
CPC ....... *H01L 21/28088* (2013.01); *H01L 29/4966* (2013.01); *H01L 21/76825* (2013.01); *H01L 21/02697* (2013.01); *H01L 29/66545* (2013.01); *H01L 21/3215* (2013.01); *H01L 21/823842* (2013.01)

USPC ........... 438/591; 438/259; 438/267; 438/270; 438/283; 438/290; 257/330; 257/331; 257/332; 257/364; 257/E21.409

(58) Field of Classification Search
None
See application file for complete search history.

(56) References Cited

U.S. PATENT DOCUMENTS

| 5,148,259 A * | 9/1992 | Kato et al. ................... 257/771 |
| 5,434,104 A * | 7/1995 | Cain et al. ..................... 438/652 |
| 7,390,709 B2 * | 6/2008 | Doczy et al. .................. 438/199 |
| 2009/0039433 A1 * | 2/2009 | Yang et al. .................... 257/365 |

OTHER PUBLICATIONS

J.I. Pankove et al., Aluminum Patterning by Ion Implantation, IEEE —1980, pp. 156-159, RCA Laboratories, Princeton, New Jersey.

* cited by examiner

*Primary Examiner* — Yasser A Abdelaziez
(74) *Attorney, Agent, or Firm* — Haynes and Boone, LLP

(57) ABSTRACT

The present disclosure provides a method of fabricating a semiconductor device that includes providing a semiconductor substrate, forming a gate structure on the substrate, the gate structure including a dummy gate, removing the dummy gate from the gate structure thereby forming a trench, forming a work function metal layer partially filling the trench, forming a fill metal layer filling a remainder of the trench, performing a chemical mechanical polishing (CMP) to remove portions of the metal layers outside the trench, and implanting Si, C, or Ge into a remaining portion of the fill metal layer.

20 Claims, 11 Drawing Sheets

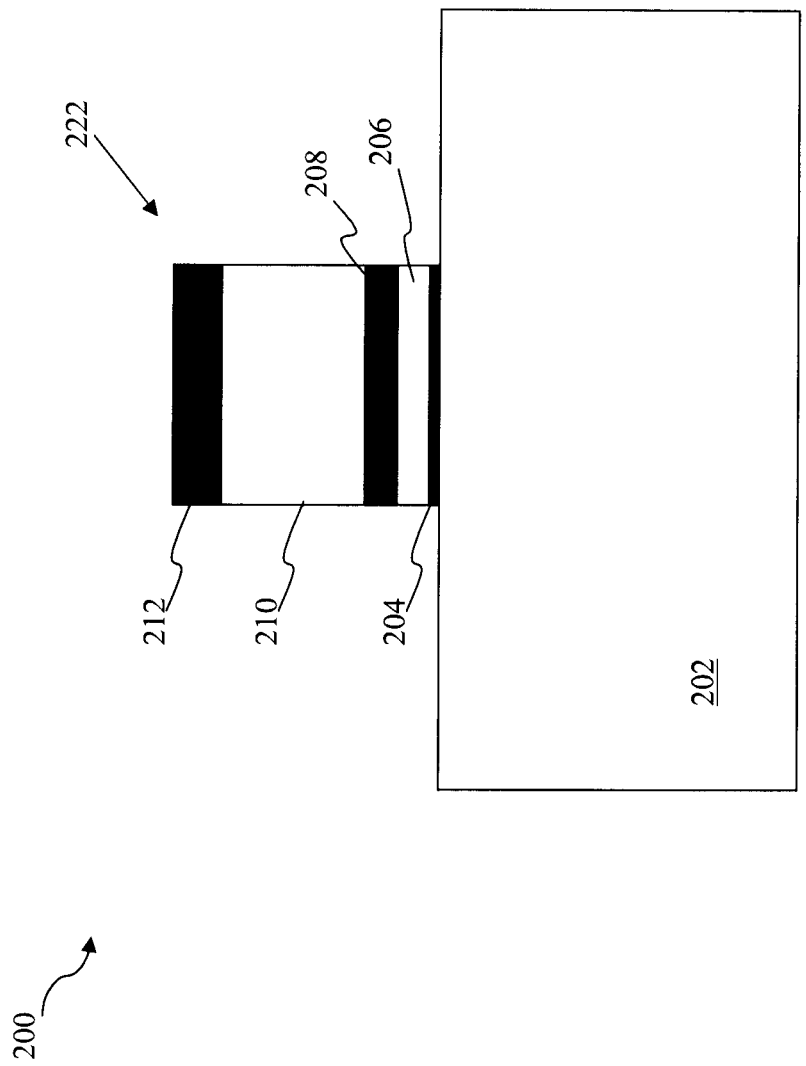

METHOD FOR IMPROVING THERMAL STABILITY OF METAL GATE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, it has been observed that the fill metal of the metal gate electrode exhibits thermal and morphological instability during subsequent processing. As a result, poor and unpredictable process control can lead to large variations in device characteristics such as gate resistance, threshold voltage, and drain current.

SUMMARY

One of the broader forms of an embodiment of the present invention involves a method for fabricating a semiconductor device. The method includes providing a semiconductor substrate; forming a gate structure on the substrate, the gate structure including a dummy gate; removing the dummy gate from the gate structure thereby forming a trench; forming a work function metal layer partially filling the trench; forming a fill metal layer filling a remainder of the trench; performing a chemical mechanical polishing (CMP) to remove portions of the metal layers outside the trench; and implanting one of Si, C, and Ge into a remaining portion of the fill metal layer.

Another one of the broader forms of an embodiment of the present invention involves a method for fabricating a semiconductor device. The method includes providing a semiconductor substrate; forming a gate stack on the substrate, the gate stack including a dummy gate; removing the dummy gate in the gate stack thereby forming a trench; depositing a first metal layer over the substrate partially filling the trench; depositing a second metal layer over the first metal layer filling a remainder of the trench; performing a chemical mechanical polishing (CMP) to remove portions of the first and second metal layers outside the trench; incorporating Si into the second metal layer during the deposition of the second metal layer or after performing the CMP.

Yet another one of the broader forms of an embodiment of the present invention involves a method for fabricating a semiconductor device. The method includes providing a semiconductor substrate; forming a gate structure on the substrate, the gate structure including a dummy electrode; removing the dummy electrode from the gate structure thereby forming a trench; forming a work function metal layer partially filling the trench; forming an Al layer filling a remainder of the trench; performing a chemical mechanical polishing (CMP) to remove portions of the work function metal layer and Al layer outside the trench; and incorporating one of Si, C, and Ge into the Al layer during formation of the Al layer or after the CMP.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A to 2I are cross-sectional views of a semiconductor device at various stages of fabrication according to the method of FIG. 1.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, the present disclosure provides examples of a "gate last" metal gate process, however one skilled in the art may recognize applicability to other processes and/or use of other materials.

Figure 1:
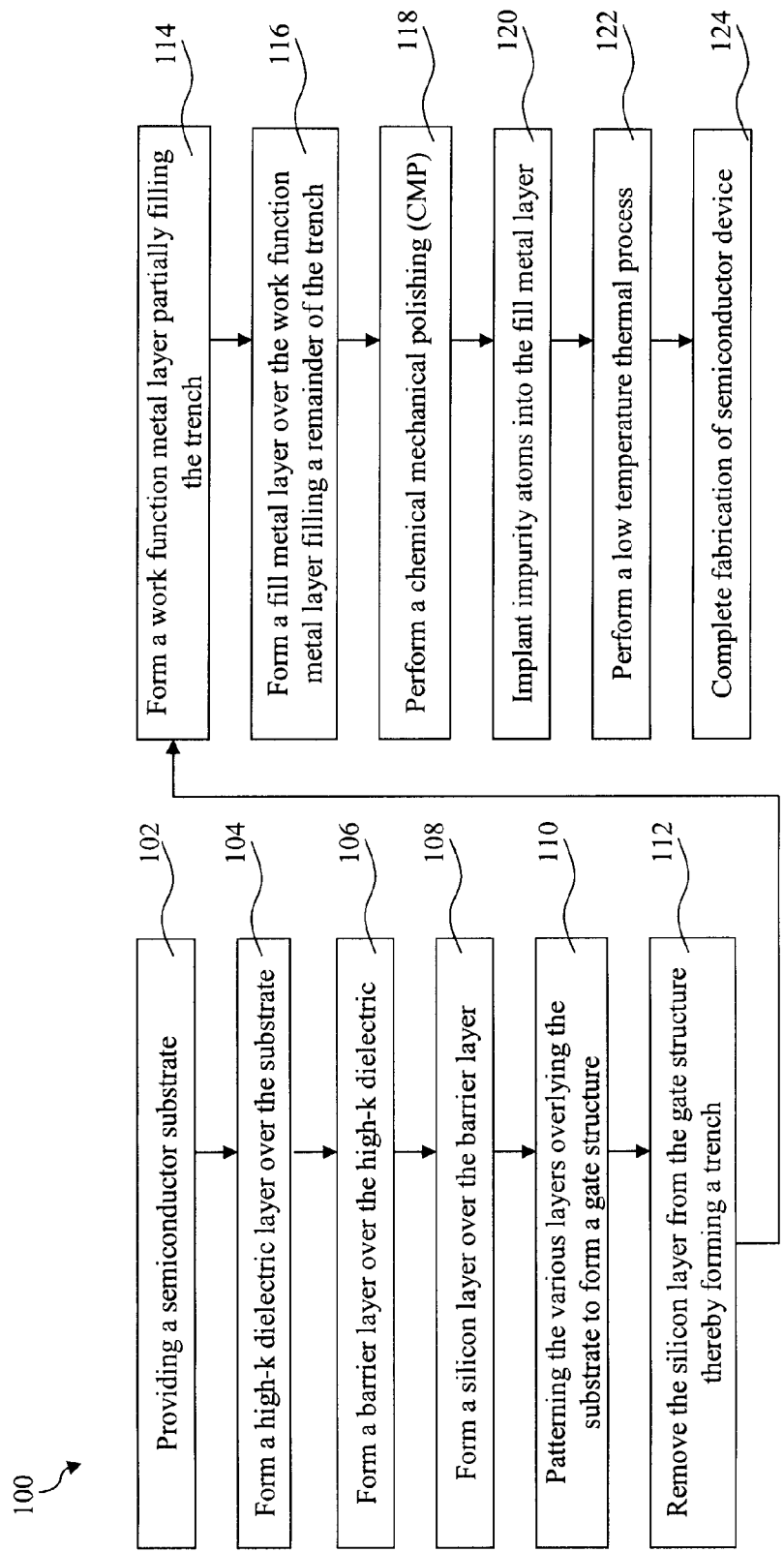
FIG. 1 is a flowchart illustrating a method for fabricating a semiconductor device with high-k metal gate according to various aspects of the present disclosure.

Referring to FIG. 1, illustrated is a flowchart of a method 100 for fabricating a semiconductor device having metal gates according to various aspects of the present disclosure. The method 100 begins with block 102 in which a semiconductor substrate is provided. The method 100 continues with block 104 in which a high-k dielectric layer is formed over the substrate. The method 100 continues with block 106 in which a barrier layer is formed over the high-k dielectric layer. The method 100 continues with block 108 in which a silicon layer is formed over the barrier layer. The method 100 continues with block 110 in which the various layer overlying the substrate are patterned to form a gate structure.

The method 100 continues with block 112 in which the silicon layer is removed from the gate structure thereby forming a trench. The method 100 continues with block 114 in which a work function metal layer is formed partially filling the trench. The method 100 continues with block 116 in which a fill metal layer is formed filling a remainder of the trench. The method 100 continues with block 118 in which a chemical mechanical polishing (CMP) is performed. The method 100 continues with block 120 in which impurity atoms are implanted into the fill metal layer. The method 100 continues with block 122 in which a low temperature thermal process is performed. The method 100 continues with block 124 in which fabrication is completed for the semiconductor device. The discussion that follows illustrates various embodiments of a semiconductor device that can be fabricated according to the method 100 of FIG. 1.

Referring also to FIGS. 2A to 2I, illustrated are cross-sectional views of a semiconductor device 200 at various stages of fabrication according to the method 100 of FIG. 1. It should be noted that part of the semiconductor device 200 may be fabricated with a CMOS process flow. Accordingly, it is understood that additional processes may be provided before, during, and after the method 100 of FIG. 1, and that some other processes may only be briefly described herein. The semiconductor device 200 may be fabricated in a gate last process (also referred to as a gate replacement process). In a gate last process, a dummy poly gate structure is initially formed and followed by a normal CMOS process flow until deposition of an inter-level dielectric (ILD). The dummy poly gate structure may then be removed and replaced with a metal gate structure.

Figure 2A:
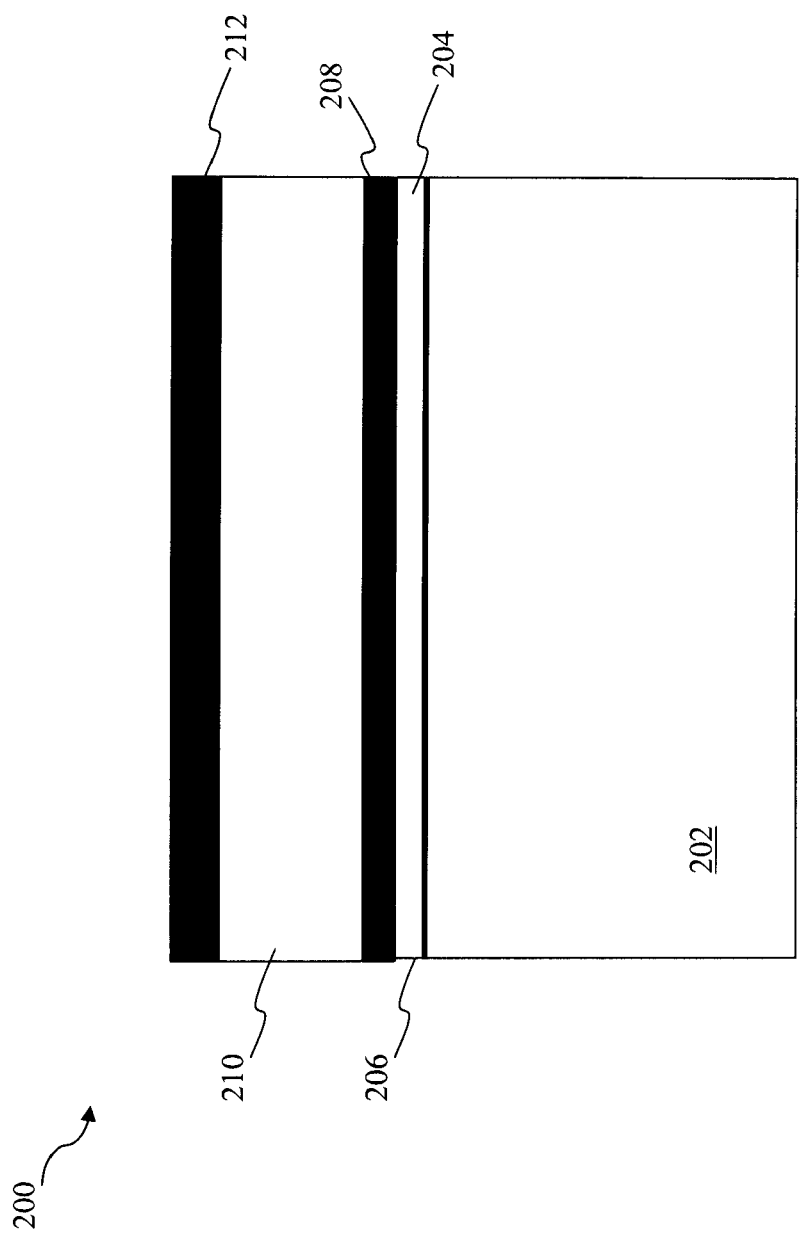

In FIG. 2A, the semiconductor device 200 may include a semiconductor substrate 202 such as a silicon substrate. The substrate 202 may alternatively include silicon germanium, gallium arsenic, or other suitable semiconductor materials. The substrate 202 may further include doped regions such as a P-well and N-well. The substrate may further include other features such as a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 200 may further include an isolation structure (not shown) such as a shallow trench isolation (STI) feature formed in the substrate 202 for isolating active regions in the substrate. As one example, the formation of an STI feature may include dry etching a trench in a substrate and filling the trench with insulator materials such as silicon oxide, silicon nitride, or silicon oxynitride. The filled trench may have a multi-layer structure such as a thermal oxide liner layer filled with silicon nitride or silicon oxide. In furtherance of the embodiment, the STI structure may be created using a processing sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical polishing (CMP) processing to etch back and planarize, and using a nitride stripping process to remove the silicon nitride. The active region may be configured for an NMOS device (e.g., n-type MOS field effect transistor) or a PMOS device (e.g., p-type MOS field effect transistor).

The semiconductor device 200 includes an interfacial layer 204 formed over the substrate 202. The interfacial layer 204 may include a silicon oxide layer (e.g., thermal or chemical oxide formation) having a thickness ranging from about 5 to about 10 angstrom (A). Alternatively, the interfacial layer 204 may include HfSiO or SiON formed by atomic layer deposition (ALD), chemical vapor deposition (CVD), physical vapor deposition (PVD), thermal oxidation, or combinations thereof.

The semiconductor device 200 further includes a high-k dielectric layer 206 formed on the interfacial layer. The high-k dielectric layer 206 may be formed by atomic layer deposition (ALD) or other suitable technique. The high-k dielectric layer 206 may include a thickness ranging from about 5 to about 20 angstrom (A). The high-k dielectric layer 206 may include hafnium oxide (HfOx). Alternatively, the high-k dielectric layer 206 may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof Further, the high dielectric layer 206 may also include Sr-based or other high-k materials with k-values higher than hafnium oxide.

The semiconductor device 200 may further include a barrier layer 208 formed over the high-k dielectric layer 206. The barrier layer 208 may include TiN or TaN having a thickness ranging from about 10 to about 20 angstrom (A). The barrier layer may function as a barrier between the high-k dielectric layer 206 and a subsequent dummy poly gate structure to reduce or eliminate the risk of Fermi level pinning between the poly and the high-k dielectric during processing. The barrier layer 208 may be formed by various deposition techniques such as ALD, physical vapor deposition (PVD or sputtering), CVD, or other suitable technique. Alternatively, it should be noted that the barrier may be formed in a gate last flow when forming the metal gates as discussed below.

The semiconductor device 200 further includes a polysilicon (or poly) layer 210 formed over the barrier layer 208 by a suitable deposition process. For example, silane (SiH4), di-silane (Si2H 6), or di-clorsilane (SiCl 2H4) may be used as a chemical gas in a CVD process to form the poly layer 210. The poly layer 210 may be referred to as a dummy poly layer since it will be replaced with a metal gate electrode as will be discussed below. The poly layer 210 may include a thickness ranging from about 200 to about 2000 angstrom (A). Alternatively, an amorphous silicon layer may optionally be formed instead of the polysilicon layer.

The semiconductor device 200 may further include a hard mask layer 212 formed on the poly layer 210. The hard mask layer 212 may include silicon oxide, silicon nitride, silicon oxynitride, silicon carbide, and/or other suitable dielectric materials, and may be formed using a method such as CVD or PVD. The hard mask layer 212 may include a thickness ranging from about 100 to about 400 angstrom (Å). Additionally, an antireflective coating layer or bottom antireflective coating (BARC) layer may be used to enhance a photolithography process for patterning a photoresist layer.

Figure 2B:
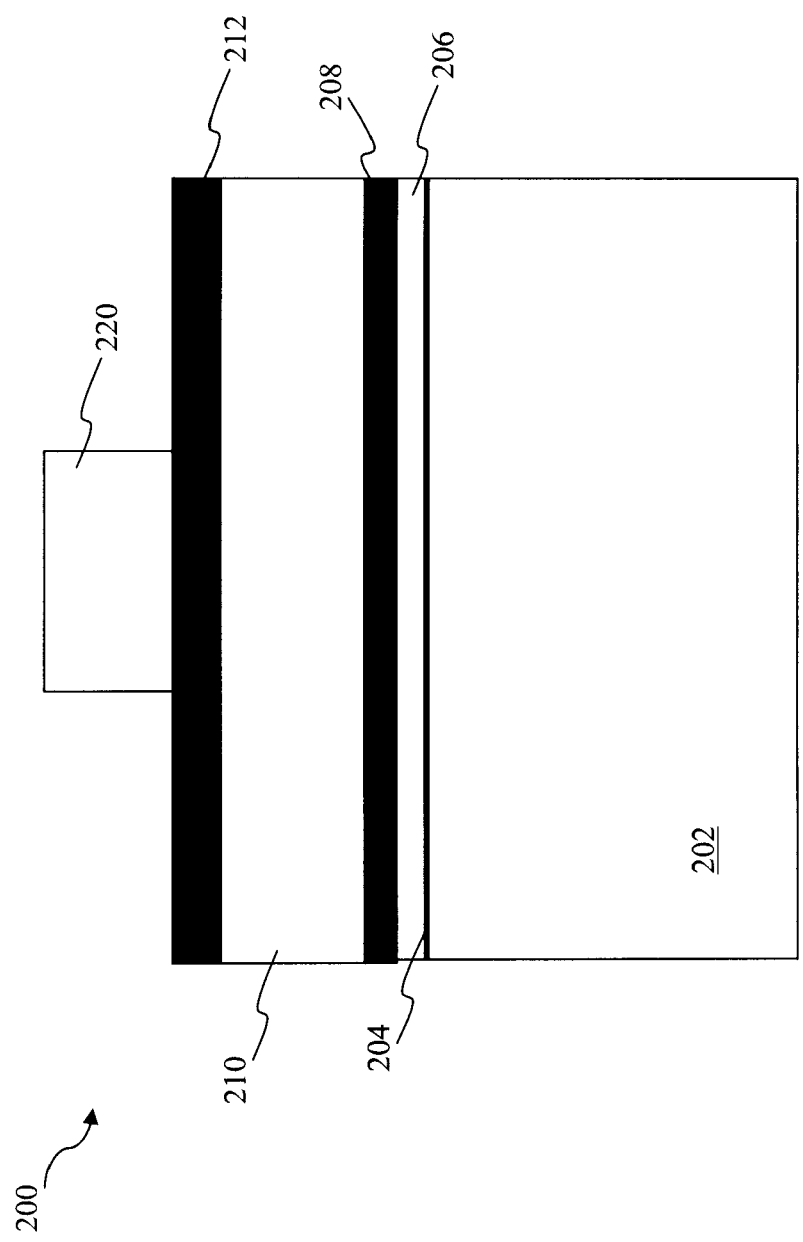

In FIGS. 2B and 2C, one exemplary method for patterning the various layers overlying the substrate to form a gate structure 222 is provided. A layer of photoresist is formed on the hard mask layer by a suitable process, such as spin-on coating, and then patterned to form a patterned photoresist feature by a proper lithography patterning method. The patterned photoresist layer 220 is formed on the hard mask layer 212. The pattern of the photoresist layer 220 is transferred to the hard mask layer 212 and then transferred to the other layers including the polysilicon layer and the high-k to form the gate structure 222. It is noted that the gate structure 222 may include a sealing layer or other suitable layer formed on the side walls of the gate structure.

Figure 2D:
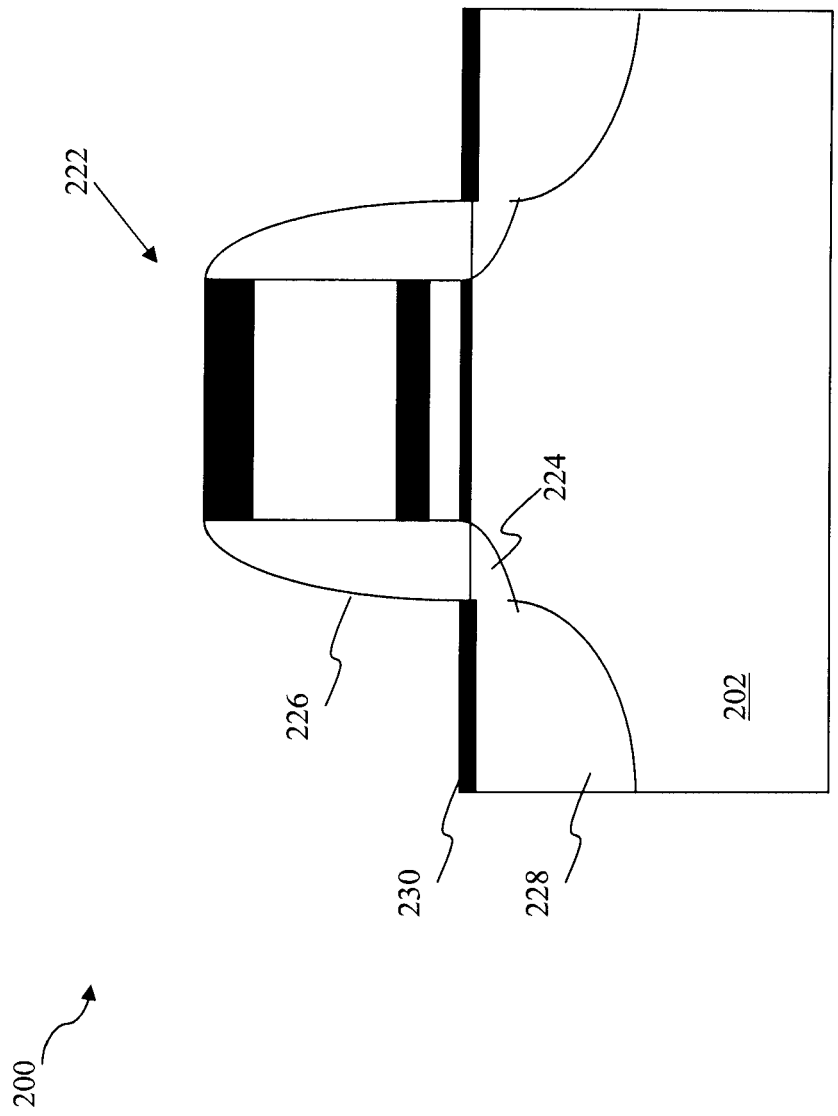

In FIG. 2D, after formation of the gate structure 222, it is understood that the semiconductor device 200 may undergo additional CMOS processing to form various features as is known in the art. As such, the various features are only briefly discussed herein. The various features may include lightly doped source/drain regions (n-type or p-type LDD) 224, sidewall spacers 226, source/drain (S/D) regions (n-type or p-type) 228, and silicide features 230.

Figure 2E:
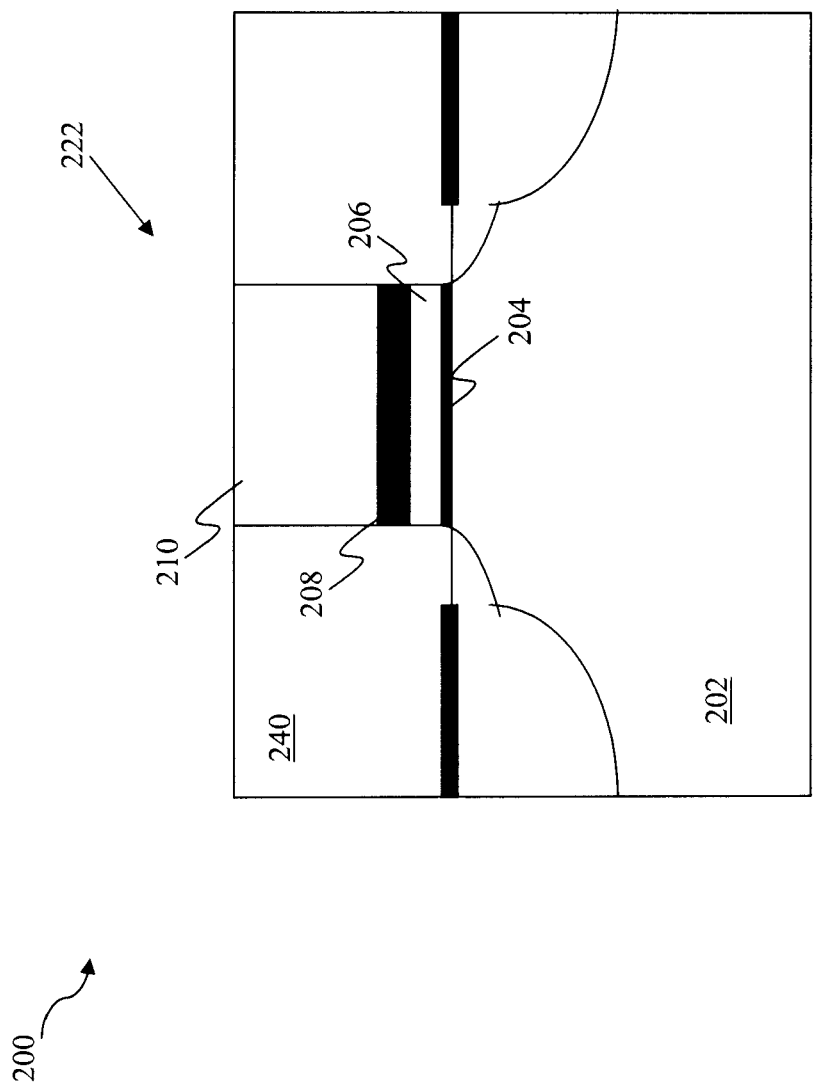

In FIG. 2E, the semiconductor device 200 is shown following a chemical mechanical polishing (CMP) and etch process that exposes the poly layer 210. A contact etch stop layer (not shown) may be formed over the substrate 202. An inter-level dielectric (ILD) 240 is formed over the substrate 202. The ILD 240 may include a oxide formed by a high aspect ratio process (HARP) and/or high density plasma (HDP) deposition process. Thereafter, a chemical mechanical polishing (CMP) process may be performed on the ILD 240 to planarize and polish the ILD until the poly layer 210 are exposed in the gate structure 222. The ILD 240 may include a oxide formed by a high aspect ratio process (HARP) and/or high density plasma (HDP) deposition process.

Figure 2F:
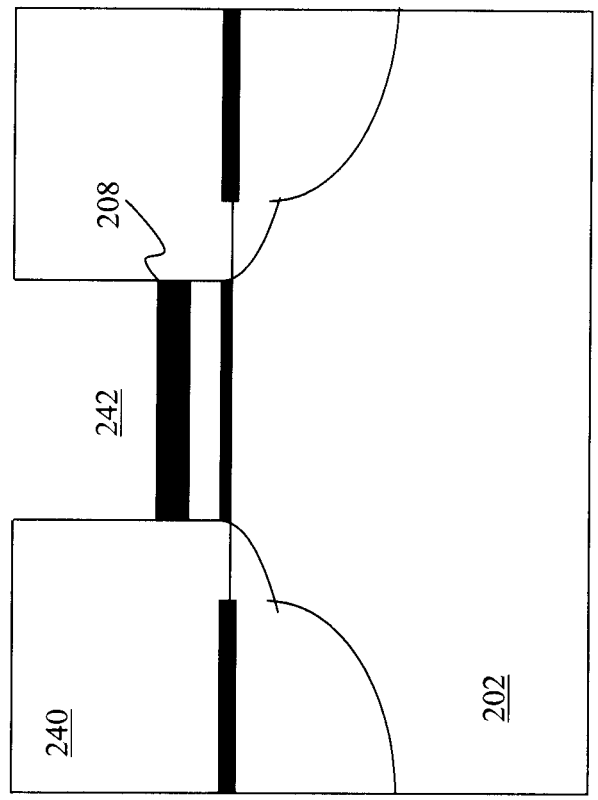

In FIG. 2F, the poly layer 210 is removed from the gate structure 222 thereby forming a trench 242. The poly layer 210 may be removed by a wet or dry etch process. For example, a wet etch process may include exposure to a hydroxide containing solution (e.g., ammonium hydroxide), deionized water, and/or other suitable etchant solutions. The barrier layer 208 may function as an etch barrier for the etching.

Figure 2G:
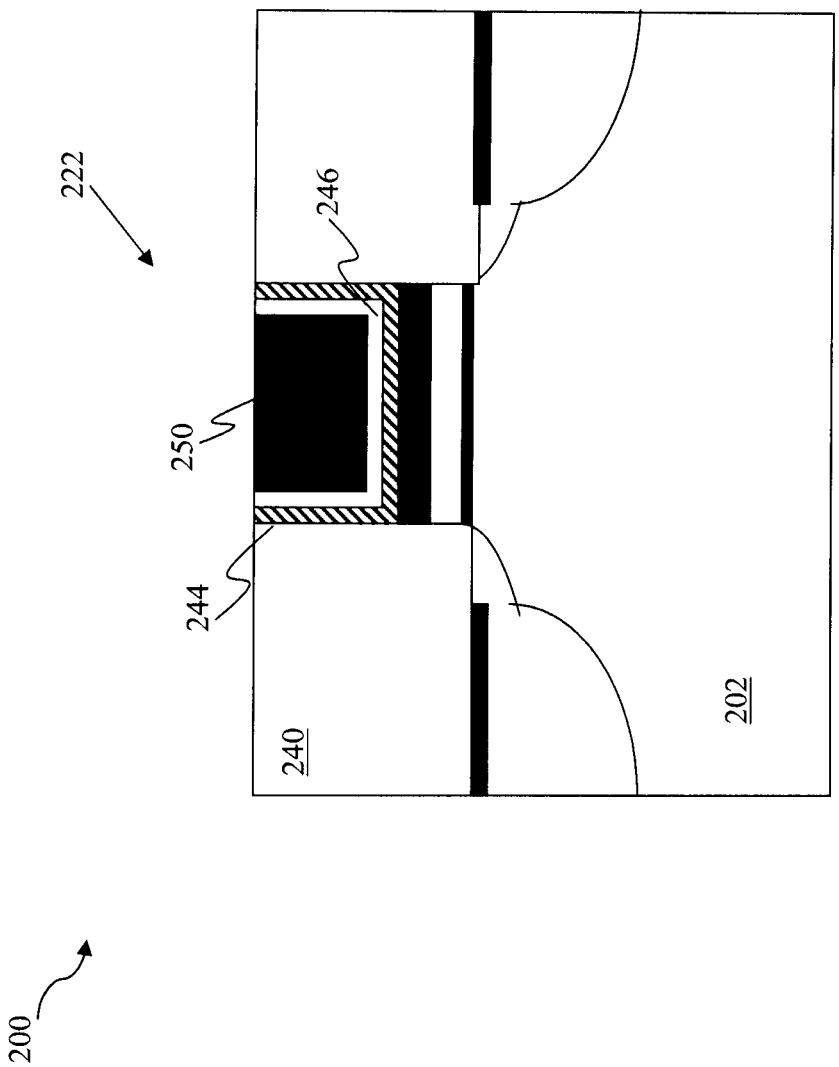

In FIG. 2G, various metal materials suitable for forming a metal gate or portion thereof, including work function layer 244, fill metal layer, liner layer, wetting layer, and adhesion layer. In an embodiment, a p-type work function metal gate (P-metal gate) may be formed in the trench 242. The P-metal gate may be formed by ALD, PVD, CVD, or other suitable process. Further, the P-metal gate layer may include a single metal layer or multi-metal layer structure with a sufficiently high effective work function (EWF) value such as TiN, TaN, Ru, Mo, Al, WN, and combinations thereof. In another embodiment, an n-type work function metal gate (N-metal gate) may be formed in the trench 242. The N-metal gate may be formed by ALD, PVD, CVD, or other suitable process. Further, the N-metal gate layer may include a single metal layer or multi-metal layer structure with a sufficiently low EWF value such as Ti, Ag, Al, TiAlN, TaC, TaCN, TaSiN, Mn, Zr, and combinations thereof.

Additionally, a layer of Ti 246 may be deposited to function as a wetting layer for a subsequent Al filling. The Ti layer 246 may be formed by PVD or other suitable process. A layer of Al 250 may be formed on the Ti layer 246 to fill in the remainder of the remainder of the trench 242. The Al layer 250 may be formed by CVD, PVD or other suitable technique. Alternatively, the fill metal layer may include copper (Cu) and tungsten (W).

A chemical mechanical polishing (CMP) may be performed on the various metal layers to planarize the semiconductor device 200. The CMP process may have a high selectivity to provide a substantially planar surface for the gate structure 222 and ILD layer 240.

Figure 2H:
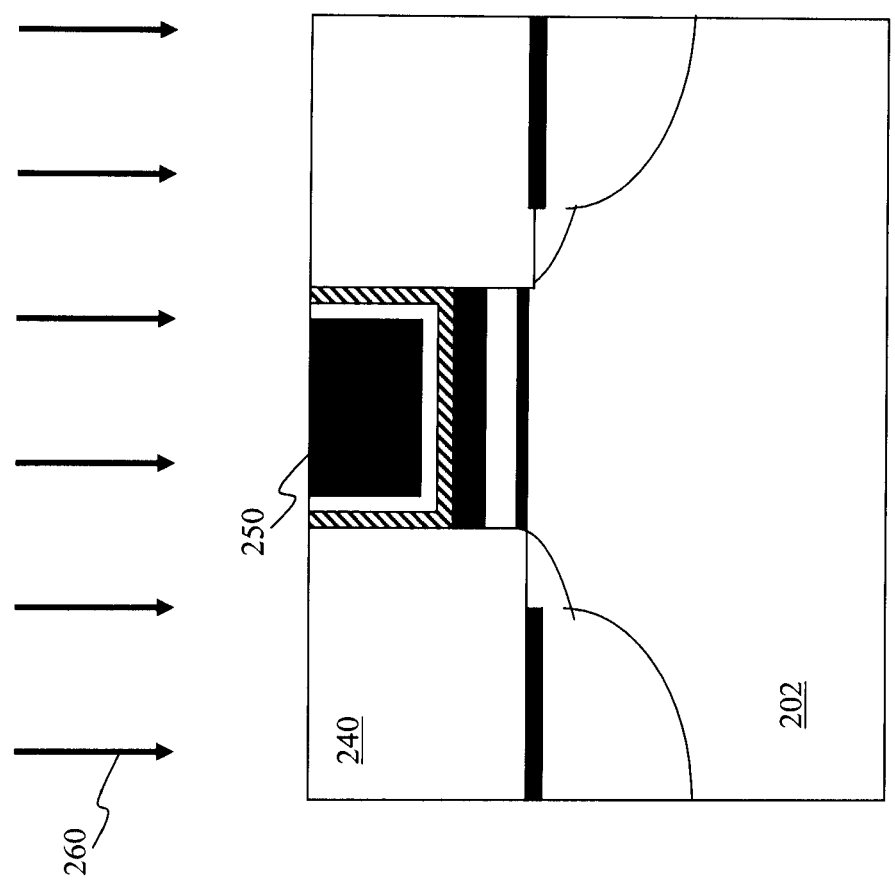

In FIG. 2H, impurity atoms or ions are incorporated into the Al layer 250 by an ion implantation process 260. The impurity atoms are selected so as not to degrade the ILD 240, and not to adversely effect the work function of the metal gate. In an embodiment, Si atoms are implanted into the Al layer 250. In other embodiments, C atoms are implanted into the Al layer 250. In some other embodiments, Ge atoms are implanted into the Al layer. The ion implantation process 260 may utilize an energy ranging from about 2 keV to about 7 keV and a dosage ranging from about 1E15 atoms/cm$^2$ to about 1E16 atoms/cm$^2$. Following the implantation process, a percentage of impurity atoms into the Al layer 250 may range from about 1E-5 (1 impurity atom in 10,000 Al atoms) to about 1E-8 (1 impurity atom in 100,000,000 Al atoms). It should be noted that the dosage and energy may be optimized to ensure that that implanted impurity atoms do not cause Al knock on further into the gate.

It has been observed that the Al layer is deposited in a crystallized structure with various grain boundaries. These grain boundaries are weak points for diffusion, and thus the Al layer may have poor thermal and morphological stability which can adversely effect subsequent processing. For example, in back end of the line (BEOL) processing, contacts are formed to connect the gate electrode to an interconnection structure (i.e. metal layers). An etchant used to etch the contact may undesirably remove some portion of the Al layer. As such, variation in gate resistance and threshold voltage across the chip will increase which may lead to poor and unpredictable device performance. The impurity atoms have a tendency to segregate to these grain boundaries due to high interfacial energy corresponding to dangling bonds in the Al layer. Accordingly, the impurity atoms will plug these grain boundaries to retard Al out-diffusion and bond with the Al to form inter-metallic phases with the Al. Therefore, the thermal and morphological stability of the Al layer is greatly improved with the incorporation of the impurity atoms.

Figure 2I:
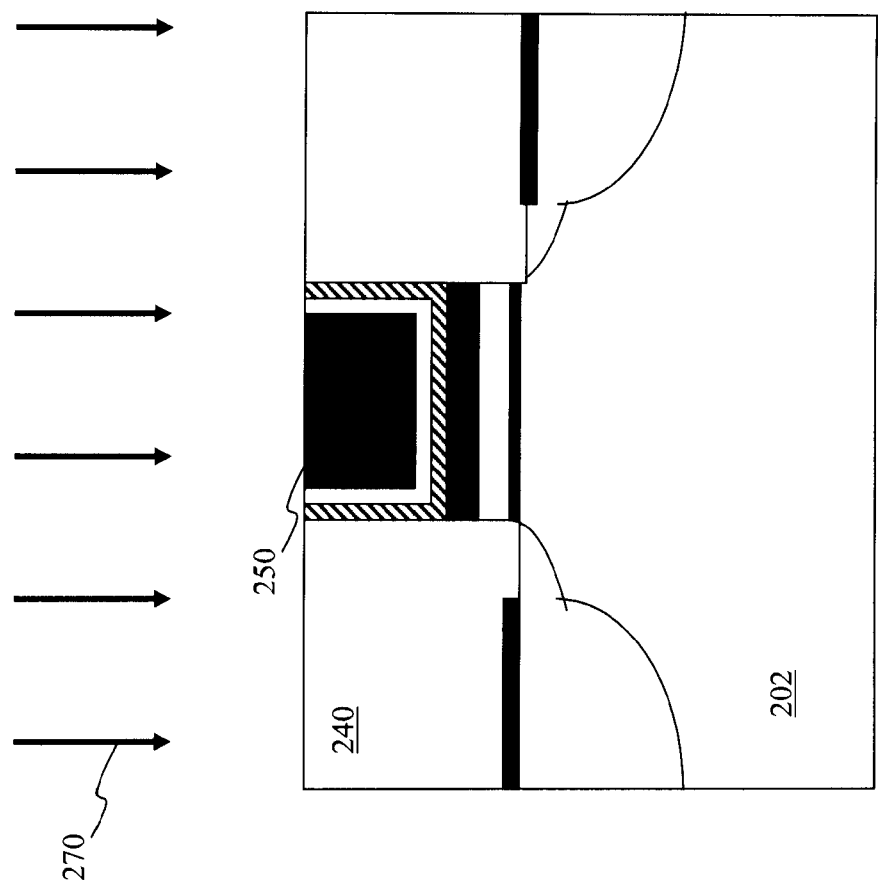

In FIG. 2I, the semiconductor device 200 may undergo a low temperature thermal process 270. The thermal process 270 may enhance diffusion of the impurity atoms to plug up the grain boundaries in the Al layer 250. The thermal process 270 is performed at a temperature ranging from about 200° C. to about 400° C. The thermal process 270 may include a rapid thermal annealing (RTA) or other suitable technique. It is understood that the semiconductor device 200 may undergo further processing to form various features such as contacts/vias, interconnect metal layers, passivation layers, etc.

Figure 3:
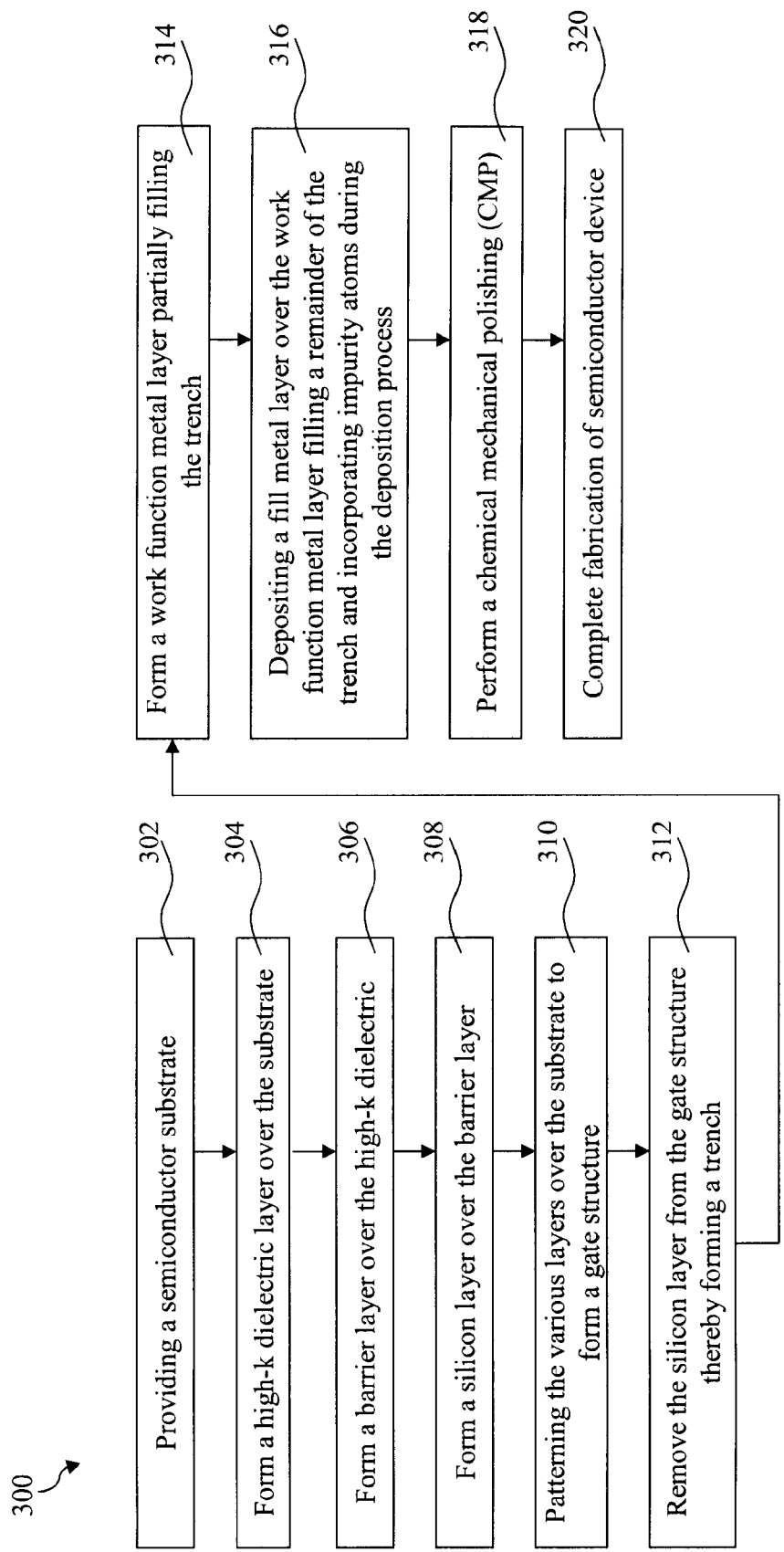
FIG. 3 is a flowchart illustrating another method of fabricating a semiconductor device with high-k metal gate according to various aspects of the present disclosure.

Referring to FIG. 3, illustrated is a flowchart of a method 300 for fabricating a semiconductor device having metal gates according to various aspects of the present disclosure. The method 300 begins with block 302 in which a semiconductor substrate is provided. The method 300 continues with block 304 in which a high-k dielectric layer is formed over the substrate. The method 300 continues with block 306 in which a barrier layer is formed over the high-k dielectric layer. The method 300 continues with block 308 in which a silicon layer is formed over the barrier layer. The method 300 continues with block 310 in which the various layer overlying the substrate are patterned to form a gate structure.

The method 300 continues with block 312 in which the silicon layer is removed from the gate structure thereby forming a trench. The method 300 continues with block 314 in which a work function metal layer is formed partially filling the trench. The method 300 continues with block 316 in which a fill metal layer is deposited filling a remainder of the trench. Additionally, impurity atoms are incorporated into the fill metal layer during the deposition process. The method 300 continues with block 318 in which a chemical mechanical polishing (CMP) is performed. The method 300 continues with block 320 in which fabrication is completed for the semiconductor device similar to block 124 of FIG. 1.

A semiconductor device being fabricated according to the method 300 of FIG. 3 is similar to the semiconductor device illustrated in FIGS. 2A to 2I except for the differences discussed below. Referring to FIG. 2H, impurity atoms such as Si, C, or Ge may be incorporated into the Al fill layer during deposition instead of after the CMP. In an embodiment, a precursor containing the impurity atom may be utilized during a CVD process. In another embodiment, a sputter target containing the impurity atom may be utilized during a PVD process. The percentage of impurity atoms may be substantially similar to the percentages disclosed above with reference to FIG. 2, and thus may have similar effects on thermal and morphological stability of the Al fill layer during subsequent processing.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, although the embodiments have been disclosed in a gate last process (or gate replacement process), the semiconductor device may be formed in high-k dielectric last process, or a combination gate first and gate last process. Additionally, the incorporation of impurity atoms/ions may be performed following the deposition of the fill metal layer, or may be performed in combination with two or more stages of fabrication. Moreover, other types of impurity atoms/ions that are compatible with CMOS technology may be utilized in a similar manner to improve the thermal and morphological stability of the metal gate.

What is claimed is:

1. A method of fabricating a semiconductor device comprising:
    providing a semiconductor substrate;
    forming a gate structure on the substrate, the gate structure including a dummy gate, an interfacial layer, and a dielectric layer;
    removing the dummy gate from the gate structure thereby forming a trench, such that the dielectric layer remains within the trench;
    forming a work function metal layer partially filling the trench, the work function metal layer formed over the dielectric layer;
    forming a fill metal layer filling a remainder of the trench;
    performing a chemical mechanical polishing (CMP) to remove portions of the metal layers outside the trench; and
    implanting one of Si, C, and Ge into a remaining portion of the fill metal layer.

2. The method of claim 1, wherein implanting one of Si, C, and Ge includes utilizing an energy ranging from about 2 keV to about 7 keV and a dosage ranging from about 1E15 atoms/cm$^2$ to about 1E16 atoms/cm$^2$.

3. The method of claim 1, further comprising performing an annealing after the implantation, the annealing being performed at a temperature ranging from about 200° C. to about 400° C.

4. The method of claim 1, wherein implanting one of Si, C, and Ge includes implanting one of Si, C, and Ge such that the one of Si, C, and Ge in the fill metal layer, measured in atoms/cm$^3$, has a percentage ranging from about 1E-5 to about 1E-8.

5. The method of claim 1, wherein forming the fill metal layer includes forming an Al layer.

6. The method of claim 5, wherein implanting one of Si, C, and Ge includes implanting Ge into the remaining portion of the Al layer.

7. A method of fabricating a semiconductor device comprising:
    providing a semiconductor substrate;
    forming a gate stack on the substrate, the gate stack including an interfacial layer, a dielectric layer, and a polysilicon layer;
    removing the polysilicon layer in the gate stack thereby forming a trench, the trench including the dielectric layer;
    depositing a first metal layer over the substrate partially filling the trench;
    depositing a second metal layer over the first metal layer filling a remainder of the trench;
    performing a chemical mechanical polishing (CMP) to remove portions of the first and second metal layers outside the trench;
    incorporating Si into the second metal layer during the deposition of the second metal layer or after performing the CMP.

8. The method of claim 7, wherein depositing the second metal layer includes performing a chemical vapor deposition (CVD) process;
    wherein incorporating Si includes providing a Si precursor in the CVD process.

9. The method of claim 7, wherein depositing the second metal layer includes performing a physical vapor deposition (PVD) process;
    wherein incorporating Si includes providing a sputtering target containing Si atoms.

10. The method of claim 7, wherein incorporating Si includes implanting Si after performing the CMP, the implantation utilizing an energy ranging from about 2 keV to about 7 keV and a dosage ranging from about 1E15 atoms/cm$^2$ to about 1E16 atoms/cm$^2$.

11. The method of claim 10, further comprising performing an annealing after the implantation, the annealing being performed at a temperature ranging from about 200° C. to about 400° C.

12. The method of claim 7, wherein incorporating Si includes incorporating Si such that the Si in the second metal layer, measured in atoms/cm$^3$, has a percentage ranging from about 1E-5 to about 1E-8.

13. A method of fabricating a semiconductor device, comprising:
    providing a semiconductor substrate;
    forming a gate structure on the substrate, the gate structure including a dummy electrode and a barrier layer;
    removing the dummy electrode from the gate structure thereby forming a trench, such that the barrier layer remains within the trench;
    forming a work function metal layer partially filling the trench;
    forming an Al layer filling a remainder of the trench;
    performing a chemical mechanical polishing (CMP) to remove portions of the work function metal layer and Al layer outside the trench; and
    incorporating one of Si, C, and Ge into the Al layer during formation of the Al layer or after the CMP.

14. The method of claim 13, wherein incorporating one of Si, C, and Ge includes incorporating one of Si, C, and Ge such that the one of Si, C, and Ge in the Al layer, measured in atoms/cm$^3$, has a percentage ranging from about 1E-5 to about 1E-8.

15. The method of claim 13, wherein incorporating one of Si, C, and Ge includes implanting the one of Si, C, and Ge into the Al layer after the CMP.

16. The method of claim 15, wherein the implantation utilizes an energy ranging from about 2 keV to about 7 keV and a dosage ranging from about 1E15 atoms/cm$^2$ to about 1E16 atoms/cm$^2$.

17. The method of claim 15, further comprising performing an annealing after the implantation, the annealing being performed at a temperature ranging from about 200° C. to about 400° C.

18. The method of claim 13, wherein incorporating one of Si, C, and Ge includes incorporating the one of Si, C, and Ge during a chemical vapor deposition or physical vapor deposition of the Al layer.

19. The method of claim 13, wherein incorporating one of Si, C, and Ge includes incorporating Si into the Al layer.

20. The method of claim 13, wherein forming the gate structure includes:
- forming an interfacial layer on the substrate;
- forming a high-k dielectric layer on the interfacial layer;
- forming the barrier layer on the high-k dielectric layer;
- forming a polysilicon layer on the barrier layer; and
- patterning the interfacial layer, high-k dielectric layer, barrier layer, and polysilicon layer to form the gate structure, wherein the patterned polysilicon layer serves as the dummy electrode.

* * * * *